United States Patent
Canning et al.

(10) Patent No.: US 12,512,383 B2
(45) Date of Patent: Dec. 30, 2025

(54) SEMICONDUCTOR PACKAGE MOUNTING PLATFORM WITH INTEGRALLY FORMED HEAT SINK

(71) Applicant: Infineon Technologies AG, Neubiberg (DE)

(72) Inventors: Timothy Canning, Regensburg (DE); Helmut Brech, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 691 days.

(21) Appl. No.: 17/703,380

(22) Filed: Mar. 24, 2022

(65) Prior Publication Data

US 2022/0319951 A1    Oct. 6, 2022

Related U.S. Application Data

(60) Provisional application No. 63/171,237, filed on Apr. 6, 2021.

(51) Int. Cl.
*H01L 23/367* (2006.01)
*H01L 23/00* (2006.01)
(Continued)

(52) U.S. Cl.
CPC ...... *H01L 23/3675* (2013.01); *H01L 23/5389* (2013.01); *H01L 24/48* (2013.01);
(Continued)

(58) Field of Classification Search
CPC ............ H01L 23/3675; H01L 23/5389; H01L 23/49822; H01L 23/50; H01L 23/3677;
(Continued)

(56) References Cited

U.S. PATENT DOCUMENTS

| 5,959,356 A | * | 9/1999 | Oh ................... H01L 23/3128 |
| | | | 257/737 |
| 2001/0038140 A1 | * | 11/2001 | Karker ................ H01L 23/057 |
| | | | 257/E23.105 |

(Continued)

FOREIGN PATENT DOCUMENTS

| CN | 110381662 A | * 10/2019 | ........... H05K 1/0204 |
| TW | 200850099 A | 12/2008 | |

*Primary Examiner* — Teresa M. Arroyo
(74) *Attorney, Agent, or Firm* — Murphy, Bilak & Homiller, PLLC

(57) ABSTRACT

A semiconductor package includes a mounting platform including an electrically insulating substrate and structured metallization layers, a semiconductor die mounted on an upper surface of the mounting platform, the semiconductor die including a first terminal and a second terminal, the first terminal disposed on a second surface of the semiconductor die that faces the mounting platform, the second terminal disposed on a first surface of the semiconductor die that faces away from the mounting platform, and a heat sink integrally formed in the mounting platform. The heat sink is directly underneath the semiconductor die and is thermally coupled to the semiconductor die. The heat sink extends from the upper surface of the mounting platform to a lower surface of the mounting platform. The heat sink includes one or more discrete metal blocks disposed within an opening formed in the electrically insulating substrate.

22 Claims, 6 Drawing Sheets

(51) Int. Cl.
*H01L 23/538* (2006.01)
*H01L 25/065* (2023.01)

(52) U.S. Cl.
CPC ............ *H01L 25/0652* (2013.01); *H01L 2224/48227* (2013.01); *H01L 2224/73265* (2013.01); *H01L 2225/0651* (2013.01)

(58) Field of Classification Search
CPC ............ H01L 23/66; H01L 23/3672; H01L 23/3736; H01L 24/40; H01L 24/49; H01L 24/73; H01L 24/48; H01L 24/29; H01L 24/32; H01L 24/37; H01L 2023/4043; H01L 2224/48227; H01L 2224/73265; H01L 2224/32225; H01L 2224/05553; H01L 2224/371; H01L 2224/40225; H01L 2224/45014; H01L 2224/48091; H01L 2224/48139; H01L 2224/48195; H01L 2224/49111; H01L 2224/49175; H01L 2224/73221; H01L 2224/73263; H01L 2224/04034; H01L 2224/04042; H01L 2224/83801; H01L 2224/8384; H01L 2224/8385; H01L 2225/0651; H01L 2924/00014; H01L 2924/13055; H01L 2924/13091; H01L 2924/15313; H01L 2924/181; H01L 2924/19011; H01L 2924/19041; H01L 2924/19105; H01L 2223/6655; H01L 2223/6666; H01L 25/0652; H01L 2924/00012; H01L 2224/45099; H01L 2924/00
See application file for complete search history.

(56) References Cited

U.S. PATENT DOCUMENTS

| | | | |
|---|---|---|---|
| 2006/0057793 A1* | 3/2006 | Hatori | H01L 29/402 257/E29.054 |
| 2006/0097382 A1* | 5/2006 | Mori | H01L 23/3677 257/E23.105 |
| 2007/0082501 A1 | 4/2007 | Hurwitz et al. | |
| 2007/0281471 A1 | 12/2007 | Hurwitz et al. | |
| 2008/0212283 A1* | 9/2008 | Chernyakov | H05K 1/0207 257/E23.105 |
| 2009/0115050 A1* | 5/2009 | Kasuya | H01L 23/3677 257/701 |
| 2010/0059879 A1* | 3/2010 | Bielen | H01L 24/73 257/E23.08 |
| 2011/0241025 A1* | 10/2011 | Sakamoto | H01L 24/97 257/E33.056 |
| 2013/0319747 A1 | 12/2013 | Hurwitz | |
| 2013/0333934 A1 | 12/2013 | Hurwitz et al. | |
| 2016/0081201 A1 | 3/2016 | Hurwitz | |
| 2020/0098660 A1* | 3/2020 | Wakaiki | H01L 21/4882 |

\* cited by examiner

SEMICONDUCTOR PACKAGE MOUNTING PLATFORM WITH INTEGRALLY FORMED HEAT SINK

BACKGROUND

Power semiconductor devices such as RF amplifiers generate a substantial amount of heat during operation. Individual dies may have a peak output power on the order of 5 W (watts) or more, and multi-die power amplifier circuits incorporated in a single semiconductor package may have a peak output power on the order of 1200 W or more. The heat generated by the semiconductor dies must be dissipated efficiently by the semiconductor package in order to prevent device failure and/or prevent degradation of electrical interfaces such as solder joints. Custom semiconductor package designs are used to dissipate large amounts of heat associated with power semiconductor devices. One example of this type of custom semiconductor package design includes a large metal substrate or flange that acts as a heat spreader and a fixed potential terminal (e.g., source or drain terminal) for the mounting of semiconductor dies thereon. However, this type of semiconductor package requires a large amount of expensive metal (e.g., copper) and is not easily adapted to different circuits. Accordingly, less expensive packaging solutions are needed for high power applications.

SUMMARY

A semiconductor package is disclosed. According to an embodiment, the semiconductor package comprises a mounting platform comprising an electrically insulating substrate and one or more structured metallization layers, a semiconductor die mounted on an upper surface of the mounting platform, the semiconductor die comprising a first terminal and a second terminal, the first terminal disposed on a second surface of the semiconductor die that faces the upper surface of the mounting platform, the second terminal disposed on a first surface of the semiconductor die that faces away from the upper surface of the mounting platform, and a heat sink integrally formed in the mounting platform, wherein the heat sink is disposed directly underneath the semiconductor die and is thermally coupled to the semiconductor die, wherein the heat sink extends from the upper surface of the mounting platform to a lower surface of the mounting platform that is opposite the upper surface of the mounting platform, and wherein the heat sink comprises one or more discrete metal blocks disposed within an opening formed in the electrically insulating substrate.

Separately or in combination, the mounting platform comprises a first insulating layer and a second insulating layer disposed on top of the first insulating layer, wherein the first insulating layer comprises a first opening, the second insulating layer comprises a second opening, and the heat sink comprises a first one of the discrete metal blocks disposed within the first opening and a second one of the discrete metal blocks disposed within the second opening.

Separately or in combination, the first insulating layer and the second insulating layer comprise at least one of: epoxy material, blended epoxy and glass fiber material, and resin material, and a thickness of the first and second insulating layers is between 25 μm and 300 μm.

Separately or in combination, the electrically insulating substrate of the mounting platform comprises any one or more of: ceramic, diamond, epoxy material, plastic, and glass.

Separately or in combination, the mounting platform comprises a first bond pad on the upper surface of the mounting platform and a first lower surface terminal on the lower surface of the mounting platform, and the semiconductor die is mounted on the mounting platform such that the first terminal directly interfaces with and electrically connects to the first bond pad, and the first terminal is electrically connected to the first lower surface terminal via the heat sink.

Separately or in combination, the semiconductor die further comprises a third terminal disposed on the first surface of the semiconductor die, the mounting platform comprises second and third bond pads on the upper surface of the mounting platform, second and third lower surface terminals on the lower surface of the mounting platform, a second vertical connector electrically connected between the second bond pad and the second lower surface terminal, and a third vertical connector electrically connected between the third bond pad and the third lower surface terminal, the second terminal is electrically connected to the second lower surface terminal via the second vertical connector, and the third terminal is electrically connected to the third lower surface terminal via the third vertical connector.

Separately or in combination, the second terminal is electrically connected to the second bond pad by a first interconnect element, the third terminal is electrically connected to the third bond pad by a second interconnect element, and the first and second interconnect elements comprise any one of the following: a bond wire, a metal clip, and a conductive ribbon.

Separately or in combination, the semiconductor die is embedded within a laminate substrate that comprises a plurality of constituent laminate layers, the second terminal is electrically connected to the second bond pad by a first internal interconnect structure, the third terminal is electrically connected to the third bond pad by a second internal interconnect structure, and the first and second internal interconnect structures are integrally formed in the laminate substrate.

Separately or in combination, the semiconductor die is configured to block voltages of at least 200V between the first and second terminals.

Separately or in combination, the semiconductor die is configured to amplify an RF signal in an RF frequency range that is at least 900 MHz.

Separately or in combination, the semiconductor die is a high electron mobility transistor.

Separately or in combination, the semiconductor die is a vertical power MOSFET or a vertical IGBT.

Separately or in combination, the heat sink comprises a plurality of the discrete metal blocks, and an overall thickness of the heat sink is between 200 μm and 1,000 μm.

Separately or in combination, an overall width of the heat sink measured in a first direction that is parallel upper surface of the mounting platform is between 50 μm and 2,000 μm.

Separately or in combination, an overall length of the heat sink measured in a second direction that is parallel upper surface of the mounting platform and perpendicular to the first direction is between 50 μm and 4,000 μm.

Separately or in combination, the heat sink comprises a plurality of the discrete metal blocks, and wherein a total metal volume of the heat sink is between $1 \times 10^7$ μm$^3$ and $2 \times 10^{10}$ μm$^3$.

Separately or in combination, the heat sink comprises a first elongated metal bar that extends past two opposite facing outer edge sides of the semiconductor die, the first elongated metal bar comprising one or more of the discrete metal blocks.

Separately or in combination, the heat sink comprises second and third elongated bars that each extend past the two opposite facing outer edge sides of the semiconductor die and each run parallel to the first elongated bar, the second and third elongated metal bars each comprising one or more of the discrete metal blocks.

An RF amplifier package is disclosed. According to an embodiment, the RF amplifier comprises a mounting platform comprising an electrically insulating substrate and one or more structured metallization layers, an RF input terminal disposed on a lower surface of the mounting platform, an RF output terminal disposed on a lower surface of the mounting platform, a power transistor die mounted on an upper surface of the mounting platform that is opposite from the lower surface of the mounting platform; and a heat sink integrally formed in the mounting platform, wherein the power transistor die is electrically connected to the RF input terminal and the RF output terminal via the mounting platform, wherein the power transistor die is configured to amplify an RF signal as between the RF input terminal and the RF output terminal across an RF frequency range, wherein the heat sink comprises one or more discrete metal blocks disposed within an opening formed in the electrically insulating substrate, and wherein the heat sink forms a thermally conductive path between the upper and lower surfaces of the mounting platform.

Separately or in combination, the RF amplifier package further comprises a discrete passive device mounted on the upper surface of the mounting platform, and the discrete passive device is either part of an input impedance matching network that is electrically coupled between the power transistor die and the RF input terminal or an output impedance matching network that is electrically coupled between the discrete power transistor and the RF output terminal.

Separately or in combination, the RF amplifier package further comprises a second discrete passive device mounted on the upper surface of the mounting platform, the second discrete passive device is part of the output impedance matching network, and the discrete passive device is part of the input impedance matching network.

A semiconductor package is disclosed. According to an embodiment, the semiconductor package comprises a mounting platform comprising an electrically insulating substrate and one or more structured metallization layers, a semiconductor die mounted on an upper surface of the mounting platform, the semiconductor die comprising first and second terminals disposed on a first surface of the semiconductor die that faces the mounting platform, and a heat sink integrally formed in the mounting platform, wherein the heat sink is disposed directly underneath the semiconductor die and is thermally coupled to the semiconductor die, wherein the heat sink extends from the upper surface of the mounting platform to a lower surface of the mounting platform that is opposite the upper surface of the mounting platform, and wherein the heat sink comprises one or more discrete metal blocks disposed within an opening formed in the electrically insulating substrate.

Separately or in combination, the mounting platform comprises first and second bond pads disposed on the upper surface of the mounting platform and first and second lower surface terminals on the lower surface of the mounting platform, the semiconductor die is mounted such that the first terminal faces and electrically connects with the first bond pad and the second terminal faces and electrically connects with the second bond pad, the first terminal is electrically connected to the first lower surface terminal via the heat sink, and the second terminal is electrically connected to the second lower surface terminal via a first internal electrical connection of the mounting platform.

Separately or in combination, the semiconductor die further comprises a third terminal that is disposed on the first surface, the mounting platform further comprises a third bond pad and a third lower surface terminal, the third terminal is electrically connected to the third lower surface terminal via a second internal electrical connection of the mounting platform, and the semiconductor die is configured as a power transistor die.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A and 1B, illustrates a semiconductor assembly that comprises a semiconductor package mounted on a circuit carrier, according to an embodiment. FIG. 1A depicts a cross-sectional view of the assembly; and FIG. 1B depicts an isometric view of the assembly.

FIGS. 2A and 2B, illustrates a single die mounting platform, according to various embodiments. FIG. 2A depicts a planar view of a single die mounting platform, according to an embodiment; and FIG. 2B depicts a planar view of a single die mounting platform, according to another embodiment.

FIGS. 4A and 4B, illustrates a semiconductor assembly that comprises an RF amplifier package mounted on a circuit carrier, according to an embodiment. FIG. 4A depicts a cross-sectional view of the assembly; and FIG. 4B depicts an isometric view of the assembly.

DETAILED DESCRIPTION

Embodiments of a semiconductor package with advantageous heat dissipation characteristics and electrical redistribution capability are described herein. The semiconductor package comprises a mounting platform that accommodates the mounting of one or more semiconductor dies thereon and optionally other devices thereon. The mounting platform includes an electrically insulating substrate and one or more structured metallization layers. In an embodiment, the mounting platform is a laminate device that is formed from a plurality of constituent laminate layers (e.g., layers of FR-4) and a plurality of structured metallization layers interposed between the constituent laminate layers. The mounting platform includes a heat sink integrally formed therein. The heat sink may be formed from one or more discrete metal blocks (e.g., copper blocks) that are disposed within openings formed in the electrically insulating portion of the substrate. This construction provides a heat sink with a large metal volume and advantageous fan-out geometry that is well-suited for heat dissipation. Moreover, the heat sink footprint is easily customizable to meet the requirements of many different package arrangements. The mounting platform may additionally comprise internal electrical interconnect elements that route electrical signals between bond pads on an upper surface of the mounting platform and lower surface terminals on a lower surface of the mounting platform. The mounting platform can therefore provide an electrical redistribution structure that allows the package to be mounted on an external circuit carrier, e.g., a PCB, with low parasitic connections between the devices mounted on the mounting platform and the circuit carrier.

Figure 1:
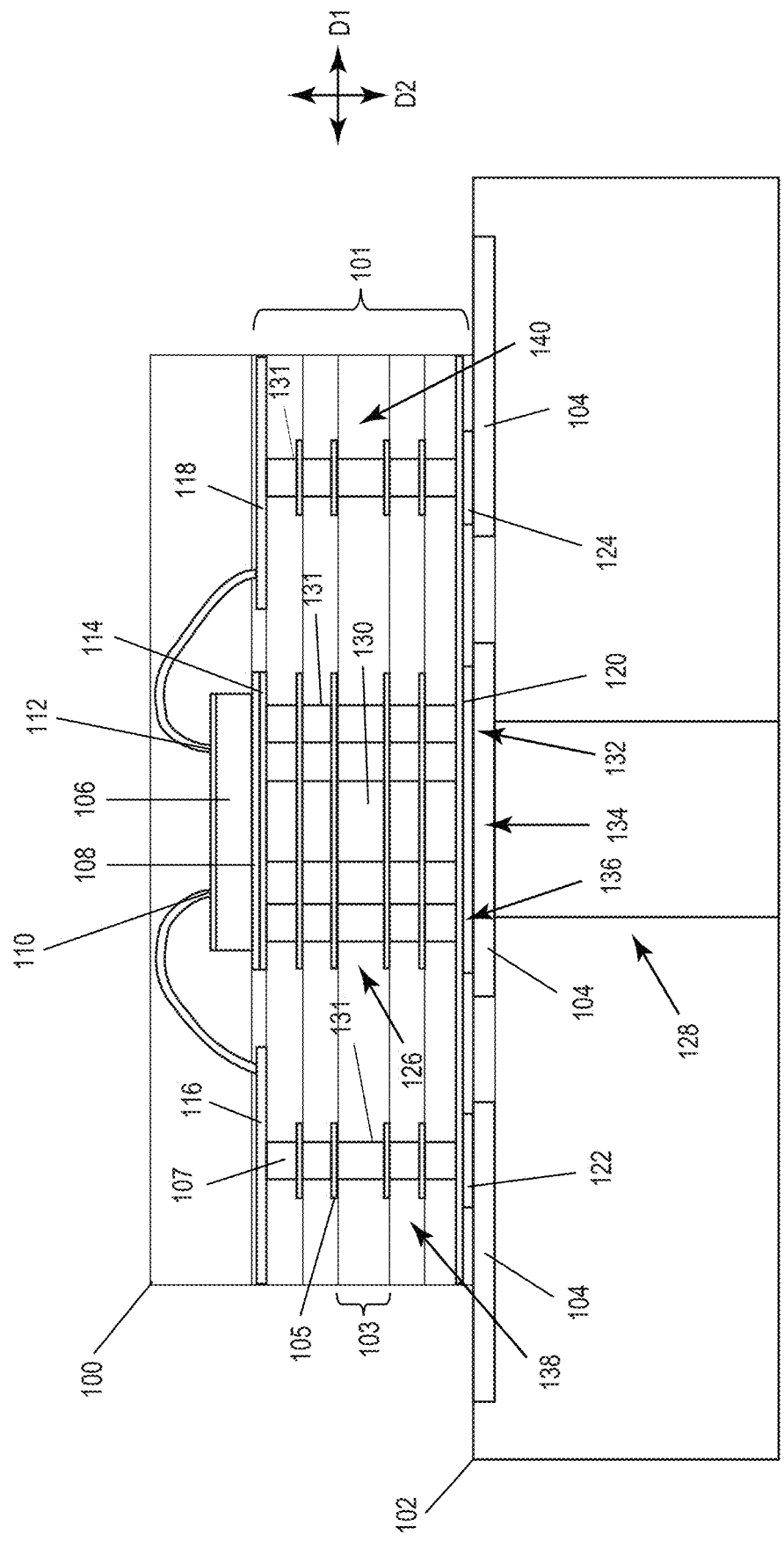
FIG. 1, which includes
Figure 1:
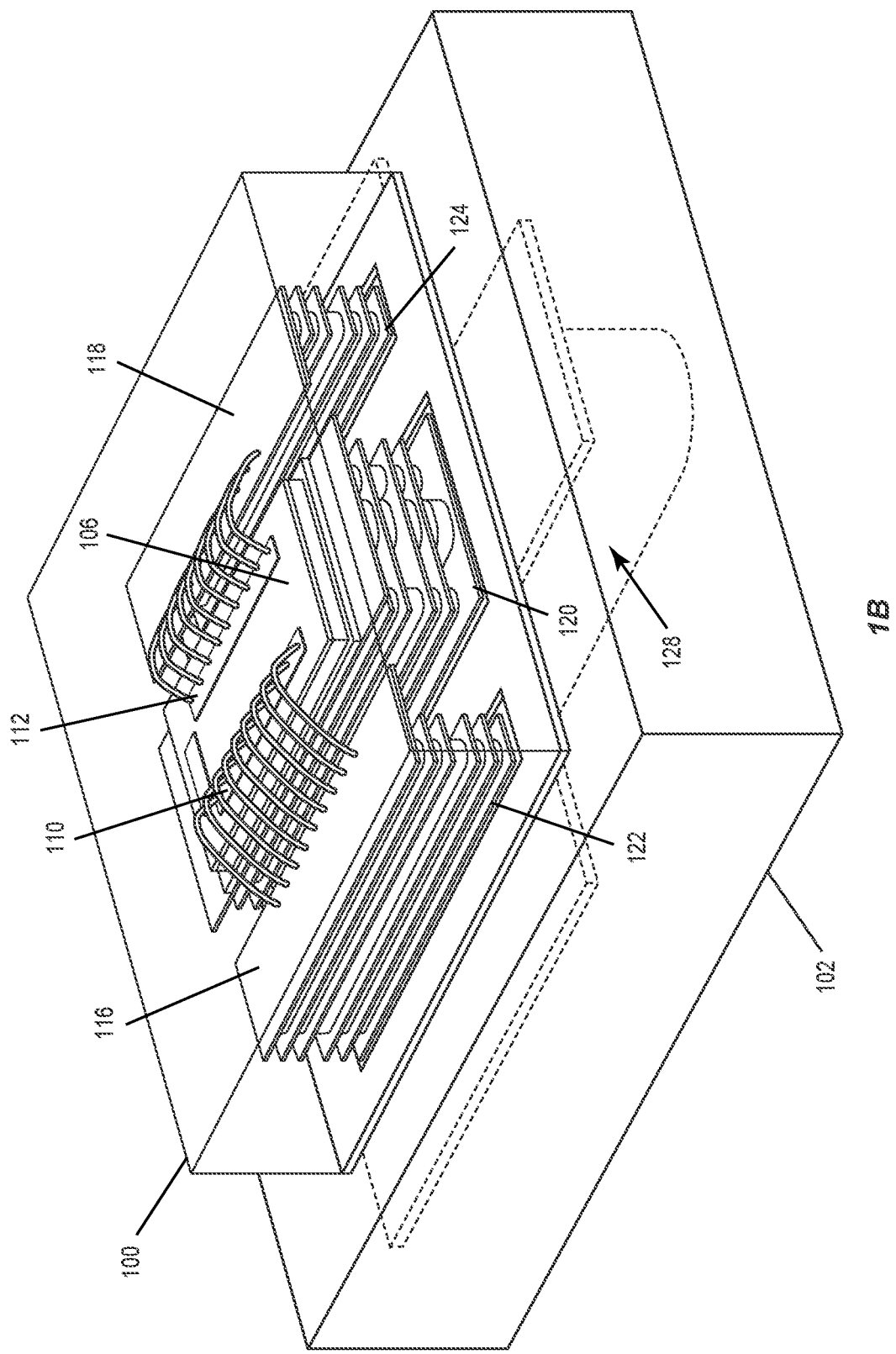

Referring to FIG. 1, a semiconductor assembly that comprises a semiconductor package 100 mounted on a circuit carrier 102 is depicted, according to an embodiment. The circuit carrier 102 is an electronics substrate that is configured to mechanically support multiple electronic components, e.g., semiconductor packages 100, passive devices, heat sinks, etc., and can be configured to provide electrical connections between these electronic components. The circuit carrier 102 comprises a number of conductive bond pads 104, which may be provided from a structured layer of metallization on an upper surface of the circuit carrier 102. According to an embodiment, the circuit carrier 102 is a printed circuit board (PCB). In that case, the circuit carrier 102 can comprise pre-peg material such as FR-4, CEM-1, G-10, etc., and the conductive bond pads 104 can be formed by structured metallization (e.g., copper) that is formed on the pre-peg material. In another embodiment, the circuit carrier 102 is a power electronics substrate, such as a DBC (direct bonded copper) substrate, AMB (active metal brazed) substrate, or an IMS (insulated metal substrate) substrate, for example. In that case, the circuit carrier 102 may comprise a ceramic material, and the conductive bond pads 104 may be formed by structured metallization (e.g., copper) features that are bonded to the ceramic material.

The semiconductor package 100 comprises a semiconductor die 106 mounted on an upper surface of a mounting platform 101. The semiconductor die 106 comprises first, second and third terminals 108, 110, 112. The first terminal 108 is disposed on a second surface of the semiconductor die 106 that faces the upper surface of the mounting platform 101. The second and third terminals 110, 112 are disposed on a first surface of the semiconductor die 106 that faces away from the upper surface of the mounting platform 101. Generally speaking, the semiconductor die 106 can have a wide variety of device configurations. According to an embodiment, the semiconductor die 106 is configured as a discrete power device that is rated to accommodate voltages of at least 5V or more, at least 30V or more, and may be on the order of 500V or more and/or is rated to accommodate currents of at least 1 A and more, and may be on the order of 10 A or more. In that case, the first and second terminals 108, 112 may be the voltage blocking terminals that accommodate the load voltage of the device. For example, the first and second terminals 108, 112 can be the drain and source terminals in the case of a MOSFET, emitter and collector terminal in the case of an IGBT, and so forth. Moreover, the first and second terminals 108, 112 can be either one of the load terminals. That is, the first terminal 108 may be the source terminal or the drain terminal, the second terminal 110 may be the opposite one of the source terminal or the drain terminal, and so forth.

The mounting platform 101 comprises an electrically insulating substrate and one or more structured metallization layers. According to an embodiment, the mounting platform 101 is a laminate device. A laminate device is produced by sequential deposition of constituent insulating layers 103 of laminate material on top of one another. Each constituent insulating laminate layer can generally comprise any dielectric material that is suitable for semiconductor applications. Examples of these dielectric materials include epoxy materials, blended epoxy and glass fiber materials such as FR-4, FR-5, CEM-4, etc., and resin materials such as bismaleimide trazine (BT) resin. A laminate device may comprise a structured metallization layer 105 of, e.g., copper, aluminium, etc., and alloys thereof, formed on top of each the constituent insulating layers 103. Thus, a laminate device may comprise multiple internal structured metallization layers 105 that are interposed between two of the constituent insulating layers 103 as well as external structured metallization layers 105 that are disposed on outermost surfaces of the laminate device. A laminate device can include via structures 107 formed from a conductive metal, such as copper, tungsten, etc. A diameter of these vias structures can be in the range of 50 μm to 125 μm, for example. These via structures 107 can be configured as vertical through-via structures that, in combination with conductive tracks formed by the structured metallization layers 105, form internal electrical interconnect paths of the laminate device. As shown, the mounting platform 101 is configured as a laminate device with six constituent insulating layers 103 of laminate material. More generally, the mounting platform 101 may comprise any different number of constituent insulating layers 103, e.g., two, four, five, six, eight, etc., with internal structured metallization layers 105 provided between some or all of these structured metallization layers 105.

In other embodiments, the mounting platform 101 is not a laminate device. That is, the mounting platform 101 is not formed by sequential deposition of multiple constituent insulating layers 103 of laminate material. For example, the mounting platform 101 can comprise an electrically insulating substrate of any one or more of the following electrical insulators: alumina ($Al_2O_3$), HTCC (high temperature cofired ceramic); LTCC (high temperature cofired ceramic), synthetic diamond, mold compound (e.g., epoxy based mold compound such as thermosetting plastic), glass, e.g., photosensitive glass-ceramic material such as APEX® Glass. The electrically and/or thermally conductive structures of the mounting platform 101 in these embodiments cam comprise a wide variety of materials such as Cu (copper), Ni (Nickel), NiP (nickel phosphorous), Ag (Silver), Pd (palladium), Au (gold), etc., and alloys or combinations thereof. These electrically and/or thermally conductive structures can be formed by a variety of techniques such as plating, sputtering, etc.

The mounting platform 101 comprises first, second and third bond pads 114, 116, 118 disposed on an upper surface of the mounting platform 101. The first, second and third bond pads 114, 116, 118 may be provided by a structured layer of metallization, e.g., a layer of copper, aluminum, etc., and alloys thereof, that can be between approximately 5 μm and 200 μm thick. The mounting platform 101 additionally comprises first, second and third external terminals 120, 122, 124 disposed on a lower surface of the mounting platform 101 that is opposite from the upper surface. The first, second and third external terminals 120, 122, 124 may be provided by a structured layer of metallization, e.g., a layer of copper, aluminum, etc., and alloys thereof, that can be between approximately 5 μm and 200 μm thick. In the case of a laminate device, the bond pads 104 on the upper surface of the circuit carrier 102 and/or the external terminals 110 on the lower surface of the mounting platform 101 may be formed by the outermost metallization layer that is deposited on the constituent insulating layers 103. Alternatively, the bond pads 104 on the upper surface of the circuit carrier 102 and/or the external terminals 110 on the lower surface of the mounting platform 101 may be formed from a separate structured metallization layer 105 that is bonded or otherwise applied to the mounting platform 101.

A heat sink 126 is integrally formed in the mounting platform 101. The heat sink 126 is a thermally conductive structure that is thermally coupled to the first bond pad 114 and is configured to extract heat away from the semiconductor die 106 during operation. To this end, the semiconductor die 106 is mounted on the first bond pad 114 and may be thermally coupled to the first bond pad 114 by a thermally conductive intermediary such as solder, sinter, conductive grease, conductive glue, etc. According to an embodiment, the heat sink 126 extends between the first bond pad 114 at the upper surface and the first external terminal 120 at the lower surface. As shown, the mounting platform 101 can be mounted such that the first external terminal 120 is contacting and/or thermally coupled to an additional heat sink 128 structure that is embedded within the circuit carrier 102. Thus, the mounting platform 101 and the circuit carrier 102 are collectively configured to efficiently extract heat generated by the semiconductor die 106 during operation.

According to an embodiment, the heat sink 126 comprises one or more discrete metal blocks 130 disposed within an opening 131 formed in the electrically insulating substrate. These discrete metal blocks 130 are prefabricated structures of thermally conductive material, e.g., copper, aluminum, tungsten, etc. that are formed separately from the electrically insulating substrate. For example, the discrete metal blocks 130 can be provided from a rigid substrate of conducive material, such as a sheet metal. The discrete metal blocks 130 can be cut into the appropriate shape to be placed within openings 131 in the electrically insulating material of the substrate and subsequently affixed thereto by an intermediary material, e.g., metal, adhesive, etc.

In the case of a mounting platform 101 that is a laminate device, a heat sink 126 comprising one or more discrete metal blocks 130 may be constructed as part of the lamination process. According to this technique, a first one of the constituent insulating layers 103 is provided. A first opening 131 is formed in the first one of the constituent insulating layers 103, e.g., by etching, cutting, etc. A first metal block 130 is provided. The first metal block 130 is prefabricated to have corresponding dimensions as the first opening 131. That is, the first metal block 130 has about the same peripheral geometry as the first opening 131 and has about the same thickness as the first one of the constituent insulating layers 103. Subsequently, a plating process is performed, e.g., electroless plating, electroplating, etc. to cover the first metal block 130 with metal and securely affix the first metal block 130 to the first one of the constituent insulating layers 103. Subsequently, the above-described process is repeated by forming a second one of the constituent insulating layers 103 on top of the first one of the constituent insulating layers 103, forming a second opening 131 in the second one of the constituent insulating layers 103, placing a second one of the discrete metal blocks 130 in the second opening 131, and so forth. This process may be performed for each one of the constituent insulating layers 103 to form a complete metal structure that extends between the upper surface and the lower surface of the mounting platform 101. Separately or in combination, multiple ones of the discrete metal blocks 130 may be provided in each constituent insulating layer, either in a common opening 131 or in separate openings 131.

In the case of a mounting platform 101 that is not laminate device, a heat sink 126 comprising one or more discrete metal blocks 130 may be constructed according to a similar technique as described above. For example, an opening may be formed in a monolithic substrate or layer of electrically insulating material, e.g., ceramic, glass, synthetic diamond, etc., may be provided. A discrete metal block, e.g., a copper block, may be provided and placed in the opening. An intermediary material such as metallization, solder, conductive glue, may be formed or provided to securely affix the discrete metal block within the opening.

Constructing the heat sink 126 from one or more discrete metal blocks 130 in the above-described manner allows for the provision of a large thermally conductive structure in the mounting platform 101 that efficiently extracts heat from the semiconductor die 106. The following values represent exemplary geometries of a heat sink 126 that can be constructed from one or more discrete metal blocks 130. The overall thickness of the heat sink 126 measured between the upper surface of the mounting platform 101 and the lower surface of the mounting platform 101 may be at least 100 µm, e.g., between about 200 µm-2,000 µm, and between 300 µm-500 µm in an embodiment. Each metal block 130 may have a thickness that is similar or identical to the constituent insulating layers 103, e.g., between about 50 µm and 200 µm. In one particular embodiment wherein the mounting platform 101 comprises six of the constituent insulating layers 103, the heat sink 126 has a thickness of 320 µm. The overall width of the heat sink 126 measured in a first direction D1 that is parallel upper surface of the mounting platform 101 may be at least 50 µm, e.g., between about 50 µm-2,000 µm, and between 100 µm-1,000 µm in an embodiment. The overall length of the heat sink 126 measured in a second direction D2 that is parallel to the upper surface of the mounting platform 101 and perpendicular to the first direction may be at least 50 µm, e.g., between about 50 µm-4,000 µm, and between 100 µm-1,000 µm in an embodiments. The overall width of the heat sink 126 and/or the overall length of the heat sink 126 may be obtained by continuous discrete metal block or blocks having this width and/or length, or by arranging multiple discrete metal blocks 130 laterally adjacent to one another. Stated in volumetric terms, a total metal volume of the heat sink 126 can be at least $5 \times 10^7$ µm$^3$, e.g., between about $1 \times 10^7$ µm$^3$-$1 \times 10^9$ µm$^3$, and between $5 \times 10^7$ µm$^3$-$5 \times 10^8$ µm$^3$ in some embodiments. The total volume of the heat sink 126 corresponds to the total volume of each discrete metal block which makes up the heat sink 126 and the volume of any metal structures contacting the discrete metal blocks 130.

As shown, the heat sink 126 may be provided by a group of metal structures that are each thermally coupled to the first bond pad 114 and are laterally separated from one another. Each of the metal structures can be constructed from one or more discrete metal blocks 130 in the above-described manner. In the depicted embodiment, the heat sink 126 comprises first, second and third metal bars 132, 134, 136. Each of the first, second and third metal bars 132, 134, 136 are elongated, meaning that a length of the metal bar exceeds its width. Each of the first, second and third metal bars 132, 134, 136 may extend past opposite facing outer edge sides of the semiconductor die 106. Each of the first, second and third metal bars 132, 134, 136 may run parallel to one another in a lengthwise direction of the metal bars. The second metal bar 134 that is centrally arranged has a greater thickness than the first and third metal bars 132, 136 in a thickness direction that is perpendicular to the lengthwise direction. The metal bars may have the following exemplary geometries. The length of the metal bars may be at least 100 µm, e.g., between about 500 µm-4,000 µm. The width of the metal bars may be between 50 µm and 200 µm, e.g., 50 μm-75 μm for the first and third metal bars and 100 μm-150 μm for the second meal bar. The elongated bar design represents one way to create a heat sink 126 from multiple structures, with each structure comprising multiple metal blocks 130, and obtain a large metal volume that distributes heat throughout the mounting platform 101. As can be appreciated from the figures, the elongated bars can have a length that is substantially close to (e.g., within 80%, 90%, 95%, etc.) an overall length of the mounting platform 101 in one direction, thereby distributing the conducted heat across a greater area. More generally, the concepts described herein may be used to provide a heat sink 126 that extends out from the footprint of the semiconductor die 106 in at least one direction, thereby leading to improved thermal performance by spreading out the heat that is conducted away from the semiconductor die 106.

According to an embodiment, the mounting platform 101 comprises internal conductive connections that enable electrical redistribution between the upper surface of the mounting platform 101 and the circuit carrier 102. Specifically, the first bond pad 114 is electrically connected to the first lower surface terminal via the heat sink 126. As shown, the first, second and third metal bars 132, 134, 136 each contact the first bond pad 114 and the first lower surface terminal and thus provide a direct electrical conduction path. The mounting platform 101 additionally comprises a second vertical connector 138 electrically connected between the second bond pad 116 and the second lower surface terminal 122, and a third vertical connector 140 electrically connected between the third bond pad 118 and the third lower surface terminal 124. The second and third vertical connectors 138, 140 can be formed by the same process and concurrently with the processes that form the heat sink 126. For example, the second vertical and third vertical connectors 138, 140 may be formed from discrete metal blocks 130 provided in openings 131 in the constituent insulating layers 103 in a similar manner as described above. This is not necessary, however. In other embodiments, the second vertical and third vertical connectors 138, 140 can be formed by any technique that is suitable for forming an electrical through-via structure. For example, the second vertical and third vertical connectors 138, 140 can be formed by depositing an electrical conductor, e.g., copper, tungsten, etc., and alloys thereof to completely fill an opening in an insulating layer.

The mounting platform 101 provides electrical redistribution between the devices mounted on the upper surface of the mounting platform 101 and the circuit carrier 102 in the following way. The mounting platform 101 is mounted on the circuit carrier 102 such that the first, second and third external terminals 120, 122, 124 face and electrically connect with corresponding bond pads 104 disposed on the circuit carrier 102. A conductive intermediary, e.g., solder, sinter, conductive glue, etc., may be provided between the external terminals 110 and the bond pads 104 disposed on the circuit carrier 102 to facilitate mechanical and electrical connection. The first terminal 108 of the semiconductor die 106 is thus electrically connected to one of the bond pads 104 disposed on the circuit carrier 102 via the direct connection with the first bond pad 114 and the heat sink 126. The second and third terminals 110, 112 of the semiconductor die 106 are electrically connected to the bond pads 104 disposed on the circuit carrier 102 via the second vertical and third vertical connectors 138, 140, respectively. Electrical connections between the second and third terminals 110, 112 of the semiconductor die 106 and the second and third bond pad 116, 118, respectively, are effectuated by interconnect elements. In the depicted embodiment, these interconnect elements are configured as wire bonds. More generally, these interconnect elements may comprise any one or more of the following: bond wires, metal clips, conductive ribbons or printed metal films. In another embodiment, the semiconductor die 106 is embedded within a laminate structure that comprises a plurality of constituent insulating layers 103. In that case, the second load terminal is electrically connected to the second bond pad 116 by a first internal interconnect structure, and the control terminal is electrically connected to the third bond pad 118 by a second internal interconnect structure. The first and second internal interconnect structures are integrally formed in the laminate substrate, i.e., structured portions of metallization layers and/or through-vias that are formed as part of the laminate substrate. This laminate structure may be formed separately from the mounting platform 101 and mounted thereon. Alternatively, the semiconductor die 106 can be embedded within a single laminate structure that comprises the features of the mounting platform 101 described herein and first and second internal interconnect structures. In that case, the second and third bond pad 116, 118 may be omitted.

The mounting platform 101 arrangement can be used in combination with any semiconductor die 106 terminal orientation, e.g., face-down, face-up, etc. For example, in another embodiment (not shown) the semiconductor die 106 comprises first, second, and third terminals 108, 110, 112 disposed on a first surface of the semiconductor die 106 that faces the mounting platform 101. The semiconductor die 106 is mounted such that each one of the first, second, and third terminals 108, 110, 112 face and electrically connect with corresponding first, second and third bond pad 114, 116, 118. In that arrangement, the first terminal 108 is connected to a first lower surface terminal of the mounting platform 101 via the heat sink 126 in a similar manner as described above. Moreover, the second terminal 110 is electrically connected to a second lower surface terminal 122 of the mounting platform 101 via a first internal electrical connection of the mounting platform 101, and the third terminal is electrically connected to a third lower surface terminal 124 of the mounting platform 101 via a third internal electrical connection of the semiconductor package 100. The first and second internal electrical connections of the mounting platform 101 may comprise conductive tracks and/or vertical via structures 107 as described above. In this face-down arrangement, the external interconnect elements, e.g., bond wires, ribbons, clips, etc. can be completely omitted. In a face-up arrangement, the orientation of the semiconductor die 106 is reversed such that the first, second, and third terminals 108, 110, 112 face away from the mounting platform 101. In that case, each of the necessary electrical connections can be effectuated by external interconnect elements, e.g., bond wires, ribbons, clips, etc., and the heat sink 126 is thermally coupled but not necessarily electrically connected to the semiconductor die 106.

Figure 2:
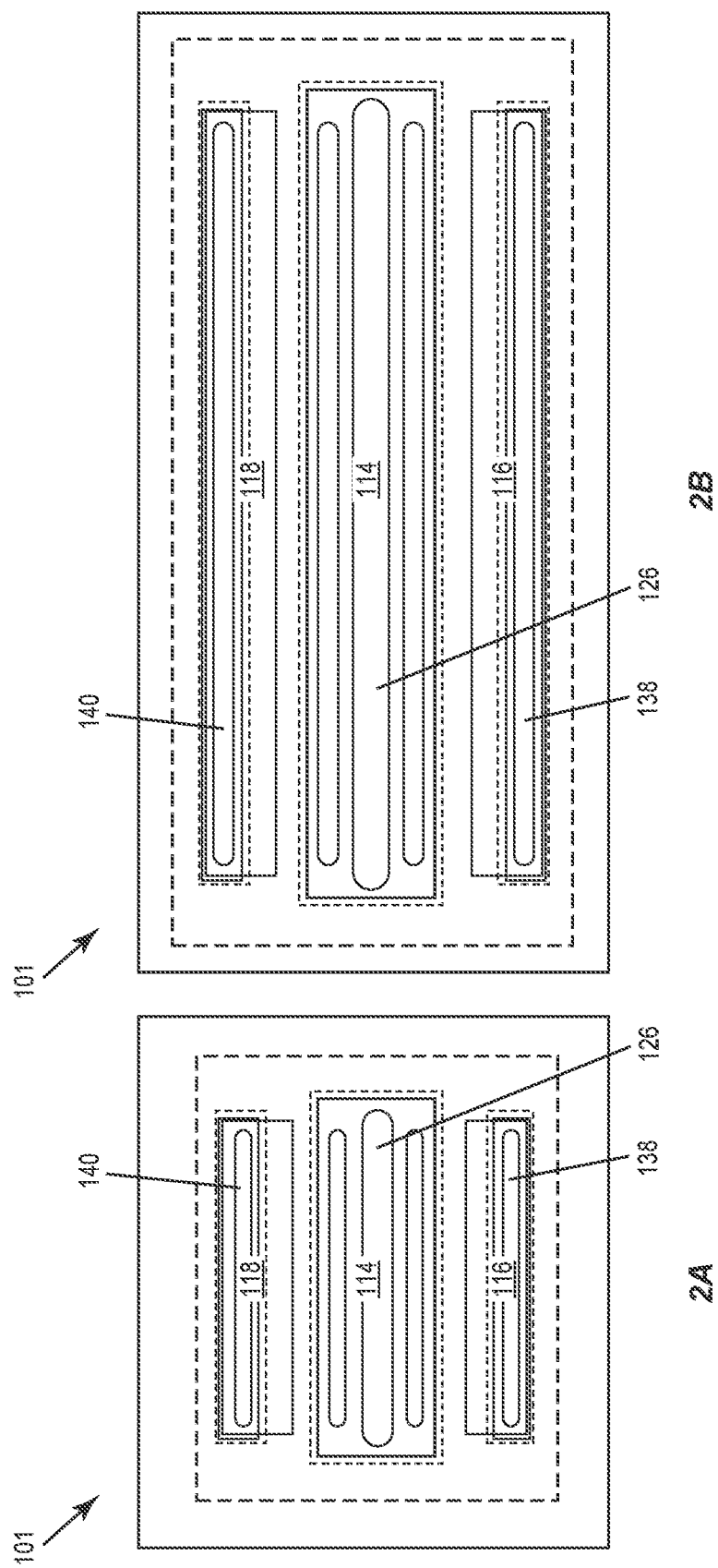
FIG. 2, which includes

Referring to FIG. 2, a mounting platform 101 that is designed for single die mounting is shown. FIG. 2A depicts one potential geometry for the first, second and third bond pads 114, 116, 118 and the underlying heat sink 126 and second and third vertical connectors 138, 140. FIG. 2B depicts another potential geometry for the first, second and third bond pads 114, 116, 118 and the underlying heat sink 126 and second and third vertical connectors 138, 140. As can be seen, each of the above-described features are comparatively longer in the embodiment of FIG. 2B than in the embodiment of FIG. 2A. For example, a length of the first, second and third bond pads 114, 116, 118 and the underlying heat sink 126 and second and third vertical connectors 138, 140 in the embodiment of FIG. 2A may be in the range of 1,000 µm-2,000 µm, and a length of the first, second and third bond pads 114, 116, 118 and the underlying heat sink 126 and second and third vertical connectors 138, 140 in the embodiment of FIG. 2A may be in the range of 2,000 µm-4,000 µm.

Figure 3:
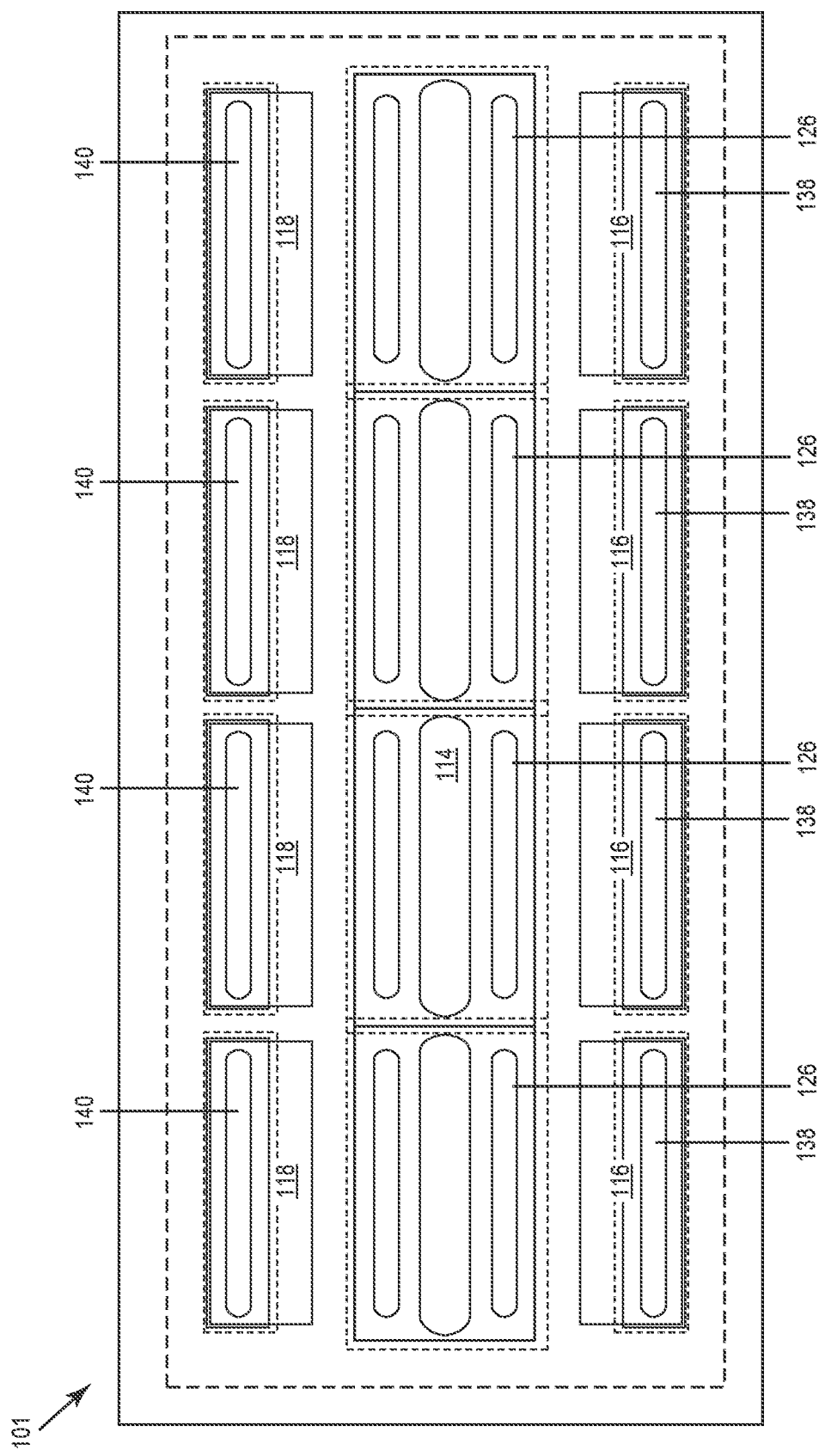
FIG. 3 illustrates a planar view of a multi-die mounting platform, according to an embodiment.

Referring to FIG. 3, a mounting platform 101 that is designed for multi-die mounting is shown. In contrast to the previously described embodiment, this mounting platform 101 comprises a plurality of die sites, wherein each of the die sites comprise first, second and third bond pads 114, 116, 118 and an underlying heat sink 126 and second and third vertical connectors 138, 140. As shown, the second and third bond pad 116, 118 for each of the die sites are electrically isolated from one another, thus enabling independent operation. A common first bond pad 114 is electrically connected with the heat sink 126 of each die site, as this node may correspond to a reference potential (e.g., GND) terminal. Alternatively, the first bond pad 114 and corresponding heat sink 126 for each die site may be electrically isolated from one another if, for instance, some of the semiconductor die 106s may be supplied with different supply voltages.

FIGS. 2-3 illustrate just a few of examples how the basic design of the mounting platform 101 can be customized to meet certain design criteria, e.g., heat dissipation capacity, package footprint size, device type, etc. In comparison to other types of semiconductor packages 100 for high voltage and/or high power applications, the physical layout of the bond pads 104 and mounting platform 101 is easily adaptable to different application requirements. A lamination technique in particular does not suffer from misalignment and tolerance issues that are associated with non-planar construction practices associated with metal flange type package construction. As a result, a semiconductor package 100 with similar heat dissipation capability as a metal flange type package can be constructed at lower costs.

Figure 4:
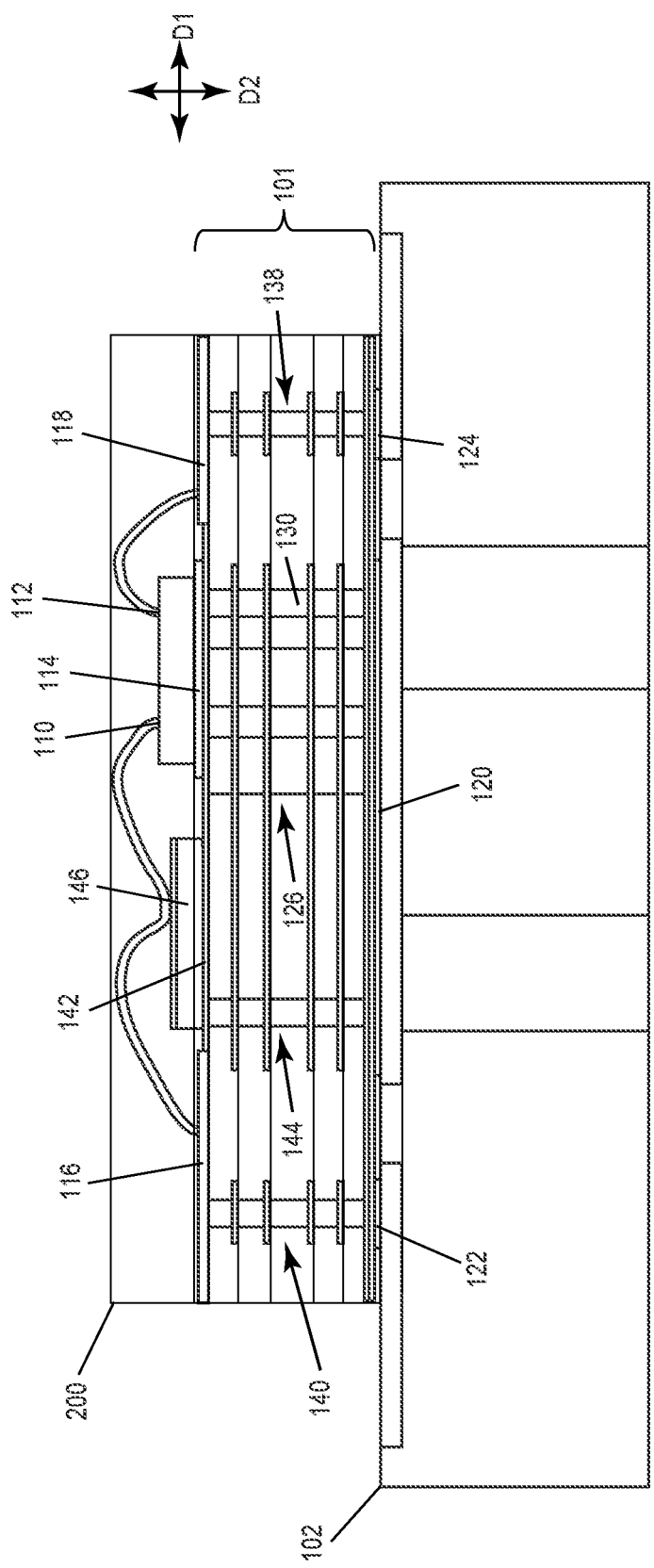
FIG. 4, which includes
Figure 4:
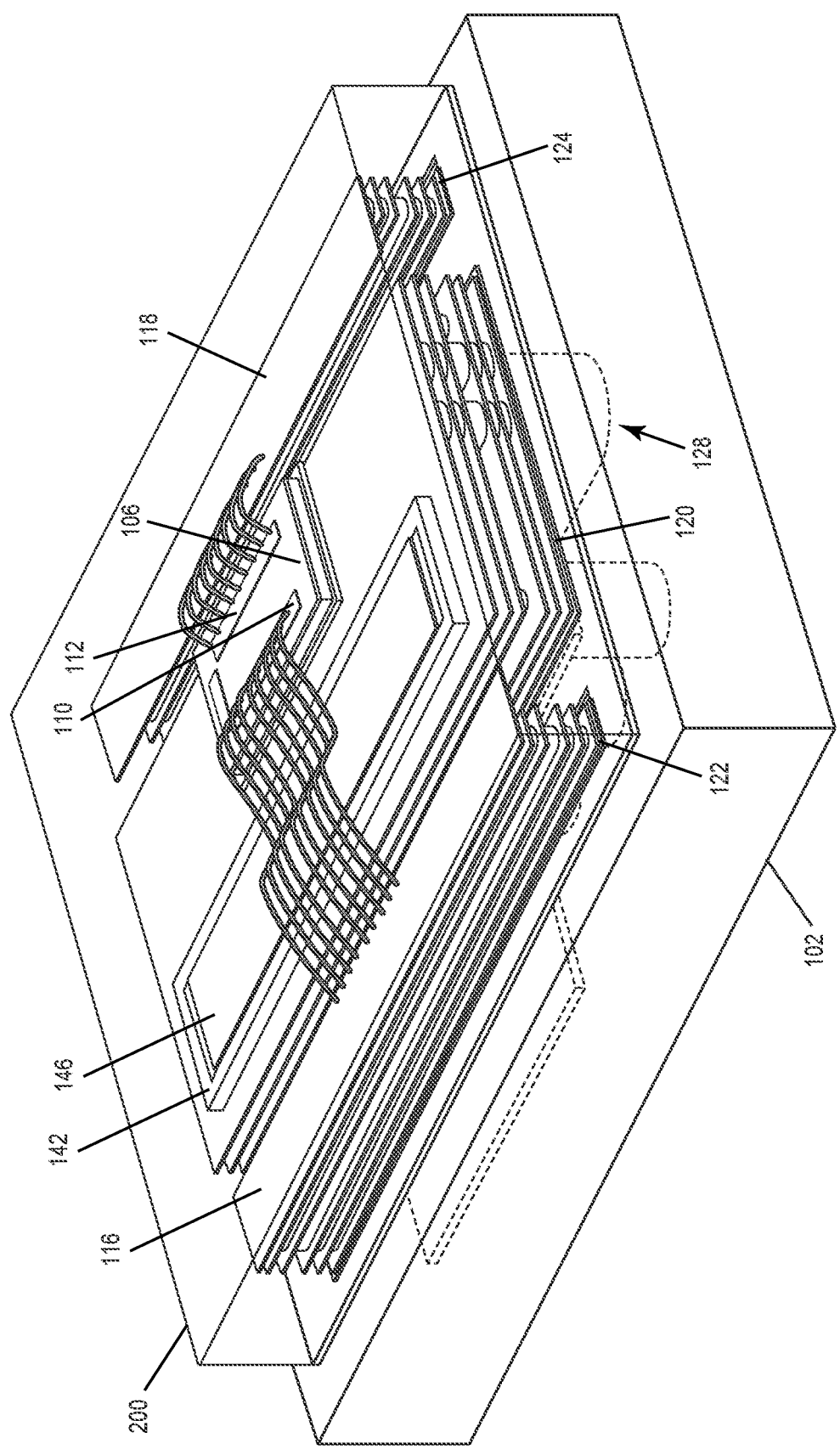

Referring to FIG. 4, an embodiment wherein the mounting platform 101 is incorporated in an RF amplifier package 200 is depicted, according to an embodiment. The mounting platform 101 can be identical to the mounting platform 101 according to any of the previously described embodiments, except that it has been adapted to accommodate additional passive elements that are part of an RF amplifier circuit. In more detail, the depicted mounting platform 101 comprises a fourth bond pad 142 disposed on the upper surface of the mounting platform 101. The fourth bond pad 142 is electrically connected to the first external terminal 120 by a fourth vertical connector 144. The fourth vertical connector 144 can have the same basic construction as the heat sink 126 and/or the second and third vertical connectors 138, 140 previously described, i.e., from one or more discrete metal blocks 130 or other electrical through-via structures 107. A discrete capacitor device 146 is mounted on the upper surface of the mounting platform 101 on the fourth bond pad 142. The discrete capacitor device 146 comprises a first terminal that faces and electrically connects with the fourth bond pad 142. The discrete capacitor 146 additionally comprises a second terminal that faces away from the upper surface of the mounting platform 101. The second terminal 110 of the semiconductor die 106 is electrically connected to the second terminal of the discrete capacitor by a first group of bond wires, which in turn is electrically connected to the second bond pad 116 on the upper surface of the mounting platform 101 by a second group of bond wires.

In the RF amplifier package 200, the third lower surface terminal 124 of the mounting platform 101 may correspond to an RF input terminal and the second lower surface terminal 122 of the mounting platform 101 may correspond to an RF output terminal. The semiconductor die 106 is configured to amplify an RF signal as between the RF input terminal and the RF output terminal across an RF frequency range. Generally speaking, the RF frequency range can be between 100 MHz and 20 GHz, or more specifically between 900 MHz and 5.4 GHz. According to an embodiment, the RF frequency range is between 1.8 GHz and 2.2 GHz with a center frequency of 2.0 GHz. Examples of devices that are configured to amplify an RF signal in these RF frequency ranges include discrete power transistor devices, such as MOSFET (metal-oxide semiconductor field-effect transistor) devices, DMOS (double-diffused metal-oxide semiconductor) transistor devices, GaN HEMT (gallium nitride high electron mobility transistor) devices, GaN MESFET (gallium nitride metal-semiconductor field-effect transistor) devices, LDMOS transistor devices, etc. In these examples, the first terminal 108 of the semiconductor die 106 may be a first load terminal (e.g., source, collector, drain, emitter etc.) that is electrically connected to a fixed reference terminal potential (e.g., GND) via the heat sink 126, the second terminal 110 of the semiconductor die 106 may be a second load terminal (e.g., source, collector, drain, emitter etc.) that is electrically connected to the RF output terminal via the first vertical connector, and the third terminal of the semiconductor die 106 may be a control terminal (e.g., gate, base, etc.) that is electrically connected to the RF input terminal via the second vertical connector 138.

In the above-described circuit, the discrete capacitor 146 forms part of an output impedance matching network of the RF amplifier circuit. The output impedance matching network is an LC network that is designed to maximize power transfer at the operating frequency of the RF amplifier circuit. For example, the output impedance matching network may be designed to filter a second order harmonic of the RF signal. As can be seen, the first terminal of the discrete capacitor 146 can be connected to the first external terminal 120 via the fourth vertical connector 144, thus enabling the discrete capacitor 146 to be connected in parallel with the semiconductor die 106 and form a shut. The capacitance value of the discrete capacitor 146 can be selected form a resonant LC circuit at a desired frequency, such as the second order harmonic of the RF signal. The inductance of this LC circuit can be obtained through appropriate geometric configuration of the first and second groups of bond pads 104. Alternatively, the inductance of this LC circuit can be provided by a discrete surface mount device that is separately mounted on the mounting platform 101. A similar concept may be used to provide an input impedance matching network of the RF amplifier circuit. In that case, an additional bond pad may be provided between the RF input terminal and the semiconductor die 106, and one or more passive devices (e.g., capacitors, resistors, etc.) may be mounted thereon and electrically coupled to the input RF amplifier circuit.

More generally, the mounting platform 101 may be adapted to accommodate a wide variety of different RF amplifier circuit configurations. For example, the mounting platform 101 may be adapted to accommodate a variety of different passive discrete components, e.g., capacitors, inductors, resistors, etc., wherein these discrete components are electrically connected to one another and/or to the circuit carrier 102 via the interposer according to the concepts described herein. These concepts allow for the provision of an RF amplifier circuit according to a wide variety of configurations in a single packaged device. Examples of these RF amplifier circuit include multi-carrier amplifiers, multiband amplifiers, LTE (long term evolution) compliant amplifiers, WCDMA (wideband code division multiple access) compliant amplifiers, an 802.11(x) compliant amplifiers, etc.

Disclosed herein is a semiconductor die 106. Generally speaking, the semiconductor die 106 can be any type of device. For example, the semiconductor die 106 can be configured as a discrete device, e.g., diode, transistor, thyristor, etc., or an integrated circuit, e.g., amplifier, driver, controller, etc. The semiconductor die 106 can comprise type IV semiconductor materials, e.g., as silicon, silicon germanium, silicon carbide, etc., and/or type III-V semiconductor materials, e.g., gallium nitride, gallium arsenide, etc. The semiconductor die 106 may be configured as a vertical device that is configured to control a current flowing between a first surface and an opposite facing second surface, or a lateral device that is configured to control a current flowing parallel to a first surface. The semiconductor die 106 may be a discrete power device. A discrete power device refers to a discrete component that is rated to accommodate voltages of at least 5V or more, at least 30V or more, at least 100V or more and more commonly on the order of 500V or more and/or currents of at least 1 A and more commonly on the order of 10 A or more. Discrete power devices include MOSFETs (Metal Oxide Semiconductor Field Effect Transistors), IGBTs (Insulated Gate Bipolar Transistors), and HEMTs (High Electron Mobility Transistors), for example.

The term "integrally formed" and the like refers to an arrangement wherein the "integrally formed" element is permanently affixed to a structure and is within the exterior boundaries of the structure. An "integrally formed" element may be formed concurrently and using common processing steps as the processing steps used to form the overall structure.

The terms "electrical connection," "electrically connected" and the like as used herein describes a low resistance electrical conduction path provided by one or more electrically conductive structures. An "electrical connection" may comprise multiple different electrically conductive structures such as bond pads 104, solder structures and interconnect lines.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
a mounting platform comprising an electrically insulating substrate and one or more structured metallization layers;
a semiconductor die mounted on an upper surface of the mounting platform, the semiconductor die comprising a first terminal and a second terminal, the first terminal disposed on a rear surface of the semiconductor die that faces the upper surface of the mounting platform, the second terminal disposed on a first surface of the semiconductor die that faces away from the upper surface of the mounting platform; and
a heat sink integrally formed in the mounting platform,
wherein the heat sink is disposed directly underneath the semiconductor die and is thermally coupled to the semiconductor die,
wherein the heat sink extends from the upper surface of the mounting platform to a lower surface of the mounting platform that is opposite the upper surface of the mounting platform,
wherein the heat sink comprises one or more discrete metal blocks disposed within an opening formed in the electrically insulating substrate,
wherein the mounting platform comprises one or more vertical connectors extending from the upper surface of the mounting platform to the lower surface of the mounting platform,
wherein the one or more vertical connectors are electrically connected with the semiconductor die, and
wherein the heat sink and each of the one or more vertical connectors are elongated structures along a first direction that is parallel to the upper surface of the mounting platform, and wherein the heat sink is longer and/or wider than the each of the one or more vertical connectors, the length of the heat sink being measured in the first direction, the width of the heat sink being measured in a second direction that is parallel to the upper surface of the mounting platform and perpendicular to the first direction.

2. The semiconductor package of claim 1, wherein the mounting platform comprises a first insulating layer and a second insulating layer disposed on top of the first insulating layer, wherein the first insulating layer comprises a first opening, wherein the second insulating layer comprises a second opening, and wherein the heat sink comprises a first one of the discrete metal blocks disposed within the first opening and a second one of the discrete metal blocks disposed within the second opening.

3. The semiconductor package of claim 2, wherein the first insulating layer and the second insulating layer comprise at least one of: epoxy material, blended epoxy and glass fiber material, and resin material, and wherein a thickness of the first and second insulating layers is between 25 μm and 300 μm.

4. The semiconductor package of claim 1, wherein the electrically insulating substrate of the mounting platform comprises any one or more of: ceramic, diamond, epoxy material, plastic, and glass.

5. The semiconductor package of claim 1, wherein the mounting platform comprises a first bond pad on the upper surface of the mounting platform and a first lower surface terminal on the lower surface of the mounting platform, and wherein the semiconductor die is mounted on the mounting platform such that the first terminal directly interfaces with and electrically connects to the first bond pad, and wherein the first terminal is electrically connected to the first lower surface terminal via the heat sink.

6. The semiconductor package of claim 5, wherein the semiconductor die further comprises a third terminal disposed on the first surface of the semiconductor die, wherein the mounting platform comprises:
  second and third bond pads on the upper surface of the mounting platform;
  second and third lower surface terminals on the lower surface of the mounting platform;
  wherein the one or more vertical connectors comprise:
   a second vertical connector electrically connected between the second bond pad and the second lower surface terminal; and
   a third vertical connector electrically connected between the third bond pad and the third lower surface terminal,
  wherein the second terminal is electrically connected to the second lower surface terminal via the second vertical connector, and
  wherein the third terminal is electrically connected to the third lower surface terminal via the third vertical connector.

7. The semiconductor package of claim 6, wherein the second terminal is electrically connected to the second bond pad by a first interconnect element, wherein the third terminal is electrically connected to the third bond pad by a second interconnect element, and wherein the first and second interconnect elements comprise any one of the following: a bond wire, a metal clip, and a conductive ribbon.

8. The semiconductor package of claim 1, wherein the semiconductor die is configured to block voltages of at least 200V between the first and second terminals.

9. The semiconductor package of claim 1, wherein the semiconductor die is configured to amplify an RF signal in an RF frequency range that is at least 900 MHz.

10. The semiconductor package of claim 1, wherein the semiconductor die is a high electron mobility transistor.

11. The semiconductor package of claim 1, wherein the semiconductor die is a vertical power MOSFET or a vertical IGBT.

12. The semiconductor package of claim 1, wherein the heat sink comprises a plurality of the discrete metal blocks, and wherein an overall thickness of the heat sink is between 200 μm and 1,000 μm.

13. The semiconductor package of claim 12, wherein an overall width of the heat sink measured in a first direction that is parallel to the upper surface of the mounting platform is between 50 μm and 2,000 μm.

14. The semiconductor package of claim 12, wherein an overall length of the heat sink measured in a second direction that is parallel to the upper surface of the mounting platform and perpendicular to the first direction is between 50 μm and 4,000 μm.

15. The semiconductor package of claim 1, wherein the heat sink comprises a plurality of the discrete metal blocks, and wherein a total metal volume of the heat sink is between $1 \times 10^7$ μm$^3$ and $2 \times 10^{10}$ μm$^3$.

16. The semiconductor package of claim 1, wherein the heat sink comprises a first elongated metal bar that extends past two opposite facing outer edge sides of the semiconductor die, the first elongated metal bar comprising one or more of the discrete metal blocks.

17. The semiconductor package of claim 16, wherein the heat sink comprises second and third elongated bars that each extend past the two opposite facing outer edge sides of the semiconductor die and each run parallel to the first elongated bar, the second and third elongated metal bars each comprising one or more of the discrete metal blocks.

18. The semiconductor package of claim 1, wherein the heat sink and each of the one or more vertical connectors are elongated structures, and wherein the heat sink is longer than each of the one or more vertical connectors.

19. The semiconductor package of claim 1, wherein the heat sink and each of the one or more vertical connectors are elongated structures, and wherein the heat sink is wider than each of the one or more vertical connectors.

20. The semiconductor package of claim 1, wherein the heat sink and each of the one or more vertical connectors are elongated structures, and wherein the heat sink is wider and longer than each of the one or more vertical connectors.

21. The semiconductor package of claim 17, wherein the second and third metal bars are shorter than the first metal bar in the first direction.

22. The semiconductor package of claim 17, wherein the second and third metal bars are narrower than the first metal bar in the second direction.

* * * * *